United States Patent
Autry et al.

[11] Patent Number: 5,923,083
[45] Date of Patent: Jul. 13, 1999

[54] PACKAGING TECHNOLOGY FOR SCHOTTKY DIE

[75] Inventors: Tracy Autry, Mission Viejo; Fernando Lynch, Anaheim; Dan Tulbure, Irvine, all of Calif.

[73] Assignee: Microsemi Corporation, Santa Ana, Calif.

[21] Appl. No.: 08/810,179

[22] Filed: Mar. 1, 1997

[51] Int. Cl.$^6$ .................................................. H01L 23/492
[52] U.S. Cl. .......................... 257/688; 257/689; 257/703; 257/730
[58] Field of Search ................................ 257/701, 703, 257/688–689, 181, 730

[56] References Cited

U.S. PATENT DOCUMENTS

| | | | |
|---|---|---|---|
| 3,280,389 | 10/1966 | Martin | 257/688 |
| 3,721,867 | 3/1973 | Schierz | 257/688 |
| 5,081,067 | 1/1992 | Shimizu et al. | 257/701 |

*Primary Examiner*—John Guay
*Attorney, Agent, or Firm*—Gary C. Honeycutt; Michael A. Sileo, Jr.

[57] ABSTRACT

A hermetic packaging technology for silicon Schottky die or any other two terminal solderable die. The technology uses a pressed ceramic frame, solid metal pads, a solid metal disc, metal seal rings, and a direct high temperature solder bond to the die. There are no intermediate straps or wires used to connect the die to the metal pads. The die is actually part of the final package, or it can be said that the package is built around the die. The device is hermetically sealed for use in high reliability applications such as military or space programs. All materials used in the technology are matched for coefficient of thermal expansion (CTE).

8 Claims, 2 Drawing Sheets

PACKAGING TECHNOLOGY FOR SCHOTTKY DIE

BACKGROUND OF THE INVENTION

1. Field of Invention

This invention relates generally to a hermetic packaging technology for a two terminal silicon die such as a Schottky rectifier having a top and bottom solder contact area. More particularly, the invention relates to such a technology comprising a pressed ceramic frame, solid metal pads, a solid metal disc, metal seal rings, and a direct high temperature solder bond to the silicon die on both sides. Furthermore, a technology wherein the device is hermetically sealed and all materials are substantially the same coefficient A E D expansion (CTE).

2. Description of Related Art

Schottky devices are used extensively in power supply and converter outputs for military and space systems. These high reliability applications require the use of a hermetically sealed package to prevent moisture from contacting the die and degrading electrical performance. There is a great need for hermetic Schottky devices in small surface mount packages to reduce the size and weight of the circuit.

Most prior designs are based on creating a separate, stand-alone hermetic package which is assembled first, then the die is attached into the package. Prior to the present invention, all designs utilized a package having straps, wires, or clips to attach the silicon die to the metal pad serving as the final contact to the circuit. The strap design is limited to the current density and thermal conductivity of the strap. The installation of the device to a circuit board using the strap design must be in a particular direction, such that the die is at the side of the package attached to the circuit, the end opposite the strap. Otherwise, the strap would limit the thermal conductivity from the die to the circuit board. This also means that reverse polarity devices must be made with the die mounted upside down inside the package, therefore the same device can not be used for different polarities.

Numerous U.S. Patents exist for hermetic surface mount packages which can be used to accommodate silicon die. Saint-Cyr U.S. Pat. No. 4,879,589 discloses a hermetic leadless (surface mount) package for Schottky die. The Saint-Cyr invention is the only previously known art which does not attempt to create a separate, stand-alone hermetic package. The invention uses metal contact pads, a ceramic frame, and a J-shaped spring contact which is welded to one of the pads. The Schottky die is then soldered to the other end of the J-shaped spring. This subassembly is then soldered together at one time with the other metal pad and the ceramic frame. There are several limitations of this design. The most serious concern is that this is a "blind" construction. It is not possible to accurately verify that the die has made intimate contact to the other metal contact pad during assembly. It is conceivable that during assembly the die may not completely bond to the other contact pad. For a high current Schottky device this is not acceptable since it will directly and negatively affect thermal resistance. Another limitation is that the size of the J-spring limits the electrical conductivity of the device. This may not be a concern during normal bias if the current is substantially low, however the J-spring directly limits the surge capability of the device, which is an important attribute of a Schottky or any other power device. The J-spring construction allows the device to be mounted only in one direction on the circuit board. If the device is mounted with the J-spring side adjacent to the circuit, the thermal path will be limited to the J-spring only which will increase the thermal resistance by many times. If a reverse polarity device is required, this constitutes a different device wherein the other side of the die is mounted to the J-spring. This is not convenient or cost effective since devices must be made specifically for the application.

SUMMARY OF THE INVENTION

One object of the invention is to provide a direct electrical and thermal connection to the die on both sides, therefore the packaged device may be mounted in either direction, negating the need for a reverse polarity device. This will also maximize the surge and electrical current capability of the device. Another object is to provide a construction technology which allows the solder connection to the die to be inspected on both sides, thus eliminating a "blind" die attach. Another object is to reduce the cost of the package by using simple materials (non-alloys) which are readily available, and to reduce the complexity of the design to allow for high volume manufacturing. A final object is to provide long term reliability in temperature cycling through the use of materials which are very close in CTE match to each other and to the silicon die. The unique aspect of this invention is that there is no separate package, in effect the package is assembled directly to and around the die.

BRIEF DESCRIPTION OF THE DRAWINGS

The above-stated objects and advantages are achieved in accordance with the specifications and drawings which follow.

DETAILED DESCRIPTION

Figure 1:
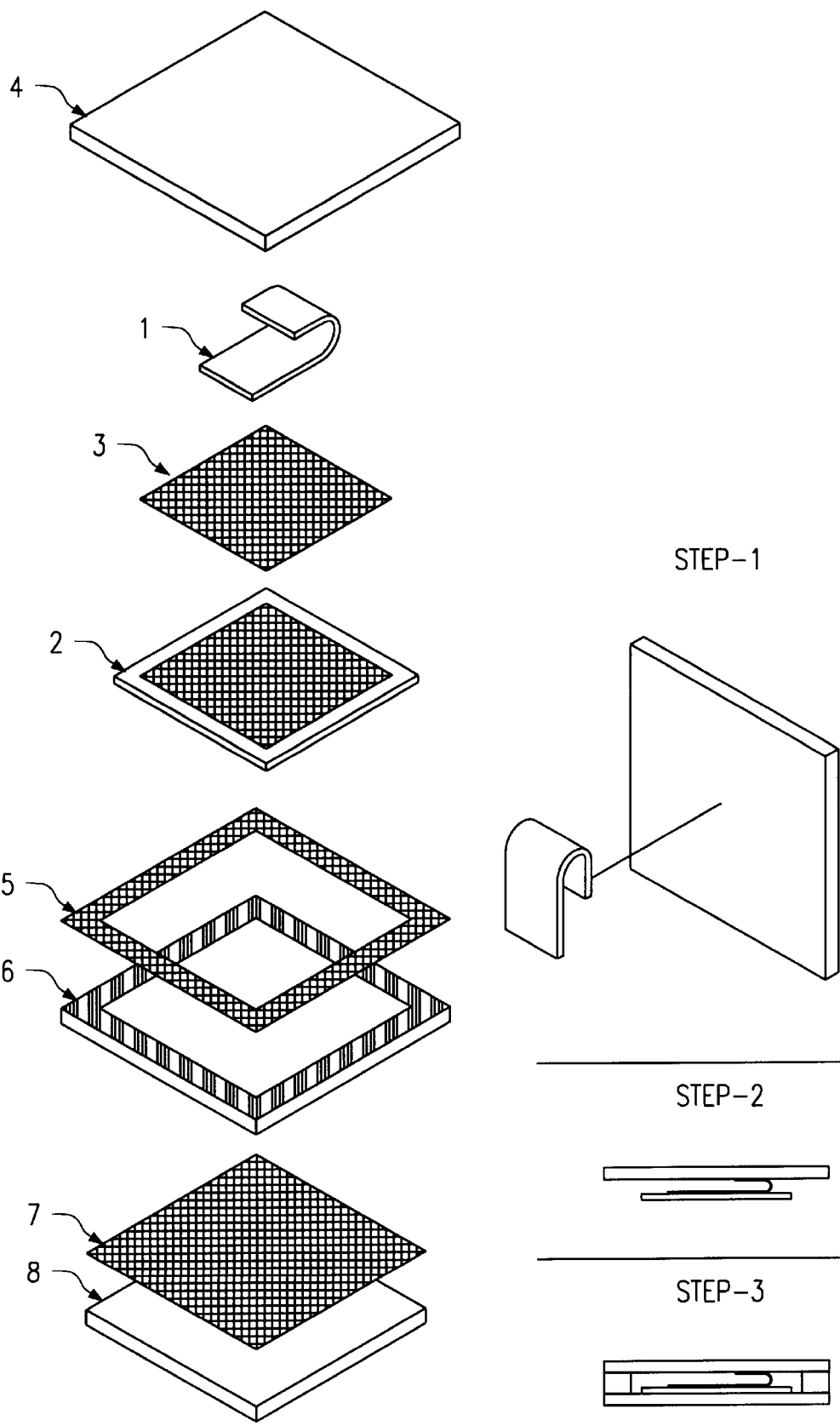
FIG. 1 is an exploded view of a surface mount Schottky package known in the prior art. The package is comprised of a copper/molybdenum/copper J-spring, molybdenum pads, an alumina (ceramic) frame, and a Schottky die.

As shown in FIG. 1, the surface mount package is an example of known prior art. The J-spring 1 is first welded or brazed to one molybdenum pad 4. The Schottky die 2 is then soldered to the J-spring 1 using a lead/tin/silver preform 3. The subassembly is then soldered together at one time with the following: the other molybdenum pad 8, a solid lead/tin/silver preform 7, an alumina ($Al_2O_3$) ceramic frame, and a square ring shaped lead/tin/silver preform 5. The prior art has the advantage of a simple construction, but is limited by the size of the J-spring. The design does not allow for visual inspection of the solder joint to the die prior to sealing the package. The risk in the design is that it attempts to simultaneously create the hermetic seal to the ceramic frame and the die attach to the molybdenum pad.

Figure 2:
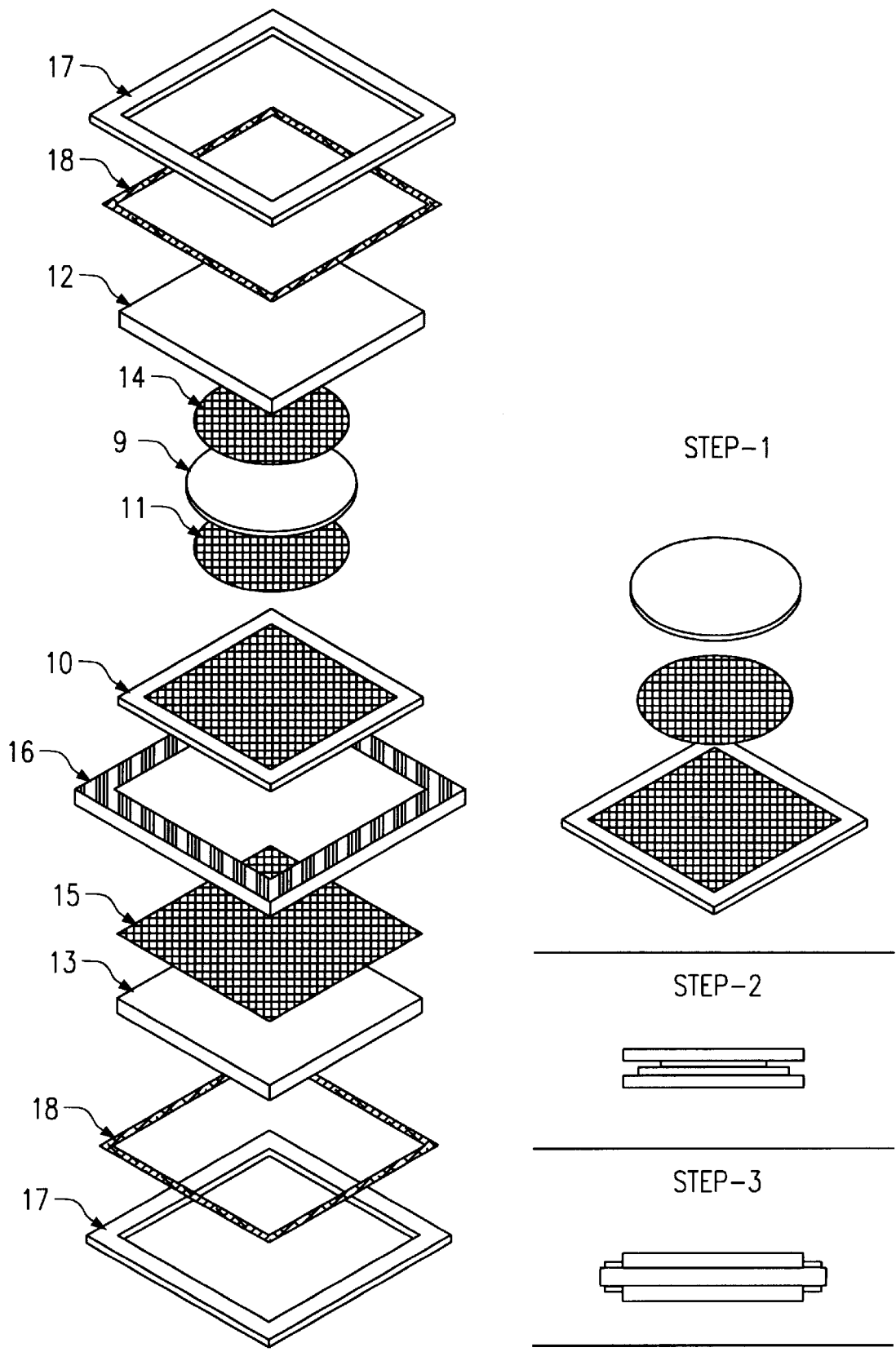
FIG. 2 is an exploded view of the invention, a packaging technology comprising a pressed mullite (or equivalent ceramic) frame, molybdenum (or tungsten) pads, a tungsten (or molybdenum) disc, Alloy 42 (or equivalent metal) seal rings, and a Schottky die.

As shown in FIG. 2, the device of the invention includes a hermetic surface mount technology containing a Schottky die with solderable metallization (contact area) on both sides. This design is superior to the existing art, particularly since it employs a direct solder bond to both sides of the die rather than a J-spring connection. The technology differs from prior designs, in that it eliminates any wires, straps, springs, or clips to connect to the die. It also differs in the order of assembly, which allows for visual inspection of the solder contact to the die on both sides, prior to sealing the package in a separate step.

In the preferred embodiment, the tungsten disc 9 (which can also be molybdenum) is essentially a flat plate, shaped to provide uniform thickness throughout, such that each major surface consists of a single plane. Pure tungsten is preferred due to its CTE (4.5 ppm/°C., or molybdenum which is 4.9 ppm/°C.) which is closely matched to silicon (4 ppm/°C.). Composite metals are rejected due to high cost and higher CTE. Tungsten has adequate thermal conductivity ($T_c$=170 W/m–K) and low electrical resistance (5.6 micro ohms-cm), especially when the thickness is limited to about 0.005".

The tungsten disc 9 is plated with about 50 micro inches of nickel, then over-plated with about 100 micro inches of gold (or silver). The tungsten disc 9 is soldered to the top side of the Schottky die 10 with gold/tin preform 11 (or lead/tin/silver, or equivalent) at over 350° C. Alignment of the disc is maintained using a fixture such as a graphite boat. The soldering is performed in a DAP sealer or belt furnace with a hydrogen or forming gas atmosphere (hydrogen/nitrogen mixture). The invention requires a Schottky die 10 which has solderable metallization such as silver or gold (not aluminum, which is designed for aluminum wire wedge bond). The tungsten disc 9 acts as a spacer to prevent the top molybdenum pad 12 (installed later) from arcing to the edge of the Schottky die 10. No spacer is required on the opposite side of the die, since the die geometry does not present a risk of arcing on both sides. Visual inspection can be performed at this step to guarantee acceptable solder bond between the tungsten disc 9 and the Schottky die 10.

The invention utilizes a top 12 and bottom 13 molybdenum (or tungsten) pad which provides the electrical and thermal connection to the outside of the device. Pure molybdenum is preferred due to its light weight and CTE (4.9 ppm/°C.) which is closely matched to silicon and tungsten. Again, composite metals are rejected due to high cost and higher CTE. Molybdenum has adequate thermal conductivity ($T_c$=140 W/m–K) and low electrical resistance (5.7 micro ohms-cm), especially when the thickness is limited to about 0.030".

The molybdenum pads 12 and 13 are plated with about 50 micro inches of nickel which is sintered (baked at over 800° C. in hydrogen to drive the plating into the molybdenum), then over-plated with about 100 micro inches of gold (or silver) and sintered (optional). Simultaneously, the top molybdenum pad 12 is soldered to the tungsten disc 9 and the bottom molybdenum pad 13 is soldered to the bottom of the Schottky die 10 with gold/tin preforms 14 and 15 (or lead/tin/silver, or equivalent) at over 350°C. Alignment is again maintained using a fixture such as a graphite boat and soldering is performed in a DAP sealer or belt furnace with a hydrogen or forming gas atmosphere. This construction is unique to the invention, and allows direct and maximum contact to the Schottky die 10, and visual inspection prior to sealing (precap inspection). Visual inspection can be performed at this step to guarantee acceptable solder bond between the tungsten disc 9 and the top molybdenum pad 12 and between the bottom molybdenum pad 13 and the Schottky die 10.

The ceramic frame 16 is a single-piece structure, made of mullite($3Al_2O_3 \cdot 2SiO_2$). Mullite is a critical material, due to its CTE (4.5 ppm/°C.) which is closely matched with silicon, tungsten, and molybdenum. Mullite is also lower cost than alumina-($Al_2O_3$). The use of a single-piece frame increases the strength, reliability, and hermeticity of the package. The mullite is either pressed or molded by tooling, then fired at about 1400° C.–1500° C. The ceramic frame 16 is selectively metallized with moly manganese (or equivalent). Either simultaneously or as a sequential operation, metallization is applied to both sides of the ceramic frame 16. The metallization is generally applied by a screen printing operation which provides an accurate deposition of a controlled thickness. The ceramic frame 16 is then fired at about 1300° C.–1400° C. to bind the metallization to the ceramic frame. The metallization is plated with about 50 to 150 micro inches of nickel. To improve adhesion of the nickel, the frame may be sintered at about 600° C.

The metal seal rings 17 are made of Alloy 42 which has a CTE of 4.3 ppm/°C. (any other metal may be used which has a close CTE to the ceramic frame 16). Alloy 42 is chosen due to its very low cost, ease of machining or stamping, and close CTE match to mullite, molybdenum, tungsten, and silicon. The ceramic frame 16 and the two seal rings 17 are soldered simultaneously to the molybdenum pads 12 and 13 with extra thick square ring shaped gold/tin preforms 18 (or lead/tin/silver, or equivalent) at over 300° C. Alignment is maintained using a fixture such as a graphite boat and soldering is performed in a DAP sealer or belt furnace with a hydrogen or forming gas atmosphere. The temperature and profile are chosen such that forming the solder seal will not reflow the die attach.

The unique construction of this invention provides for an increase in hermetic seal area, since the preform 18 can bond simultaneously to three surfaces: the seal rings 17, the sides of the molybdenum pads 12 and 13, and the metallization on the ceramic frame 16. This provides superior hermetic seal and improved mechanical strength. The periphery of the solder seal may be visually inspected for solder fillet and the device can be tested for fine and gross leak test to verify the hermetic seal. Solder seal is preferred because it is a low cost process and does not transfer stress to the ceramic frame. Silicon Schottky die must be sealed in a controlled atmosphere to prevent moisture from contaminating the junction. Solder seal can be performed in a DAP sealer or belt furnace for high volume, low cost manufacturing, while maintaining a controlled atmosphere. It is apparent that there has been provided in accordance with this invention an improved technology for packaging Schottky die, fully satisfying the objects, means and advantages set forth above. While the invention has been described in combination with specific embodiments and examples thereof, many alternatives, modifications and variations will be apparent to those skilled in the art, after reading the foregoing description. For example, although a silicon Schottky device is illustrated in detail, the invention also applies to any other die with solderable contacts. Accordingly, it is intended to embrace all such alternatives, modifications and variations within the spirit and scope of the appended claims.

What is claimed is:

1. A packaged microelectronic device comprising a silicon die having a solderable metallization contact on each of first and second major surfaces;

a first metal pad comprised of tungsten or molybdenum solder-bonded to said first major surface;

a flat metal spacer solder-bonded to said second major surface, said spacer shaped to provide uniform thickness throughout, such that each major surface of the spacer consists of a single plane;

a second metal pad comprised of tungsten or molybdenum solder-bonded to said spacer;

a ceramic frame surrounding said die and pads; and sealing means bonding said frame to said pads, thereby completing enclosure of said die.

2. A device as in claim 1, wherein said frame consists essentially of mullite.

3. A device as in claim 1, wherein each of said pads is about 0.030 inches thick.

4. A device as in claim 1, wherein said spacer is about 0.005 inches thick.

5. A packaged microelectronic device consisting essentially of a silicon die having a solderable metallization contact on each of first and second major surfaces;

a first metal pad solder-bonded to said first major surface;

a flat metal spacer solder-bonded to said second major surface, said spacer shaped to provide uniform thickness throughout, such that each major surface of said spacer consists of a single plane;

a second metal pad solder-bonded to said spacer;

a ceramic frame surrounding said die and pads; and sealing means bonding said frame to said pads, thereby completing enclosure of said die.

6. A device as in claim 5, wherein said frame consists essentially of mullite.

7. A device as in claim 5, wherein each of said pads is about 0.030 inches thick.

8. A device as in claim 5, wherein said spacer is about 0.005 inches thick.

* * * * *